United States Patent [19]
Sung

[11] Patent Number: 5,789,291
[45] Date of Patent: Aug. 4, 1998

[54] DRAM CELL CAPACITOR FABRICATION METHOD

[75] Inventor: Janmye Sung, Yang-Mei, Taiwan

[73] Assignee: Vanguard International Semiconductor Corporation, Hsinchu, Taiwan

[21] Appl. No.: 512,238

[22] Filed: Aug. 7, 1995

[51] Int. Cl.$^6$ .................................... H01L 21/8242
[52] U.S. Cl. ............................ 438/254; 438/397
[58] Field of Search ........................ 438/253, 254, 438/396, 397

[56] References Cited

U.S. PATENT DOCUMENTS

| | | | |
|---|---|---|---|
| 5,126,280 | 6/1992 | Chan et al. | 438/252 |
| 5,290,729 | 3/1994 | Hayashide et al. | 437/60 |
| 5,399,518 | 3/1995 | Sim et al. | 437/52 |
| 5,438,011 | 8/1995 | Blalock et al. | 438/396 |
| 5,441,909 | 8/1995 | Kim | 438/397 |
| 5,565,372 | 10/1996 | Kim | 438/253 |
| 5,580,811 | 12/1996 | Kim | 438/253 |

*Primary Examiner*—Charles L. Bowers, Jr.
*Assistant Examiner*—Toniac Thomas
*Attorney, Agent, or Firm*—George O. Saile; Stephen B. Ackerman

[57] ABSTRACT

A process for fabricating stacked capacitor, DRAM devices, wherein the surface area of the capacitor is significantly increased as a result of sidewall processes, has been developed. The process is highlighted by deposition of polysilicon, to be used for the lower electrode of the stacked capacitor structure, on specific underlying insulator shapes. As a result of the severe underlying insulator topography, a significant portion of the polysilicon forms on the sides of the underlying insulator shapes, creating a significant increase in the lower electrode surface area, which relates to marked increases in capacitance and device signal.

23 Claims, 5 Drawing Sheets

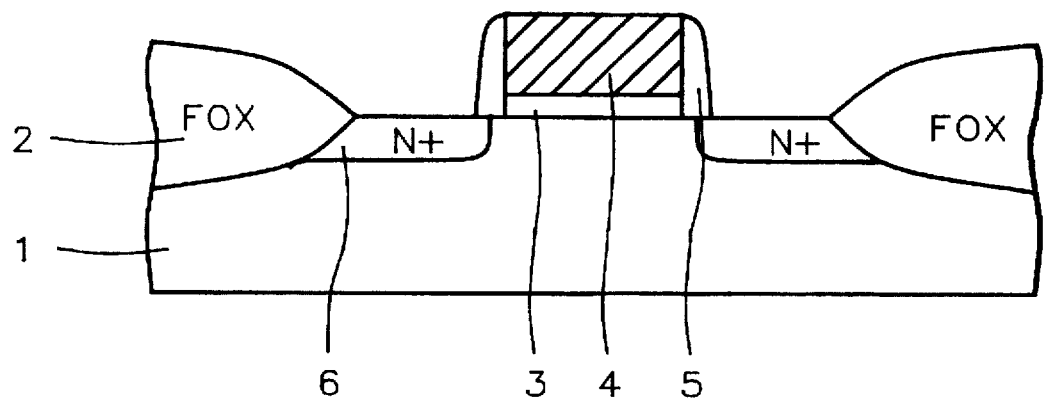
FIG. 1
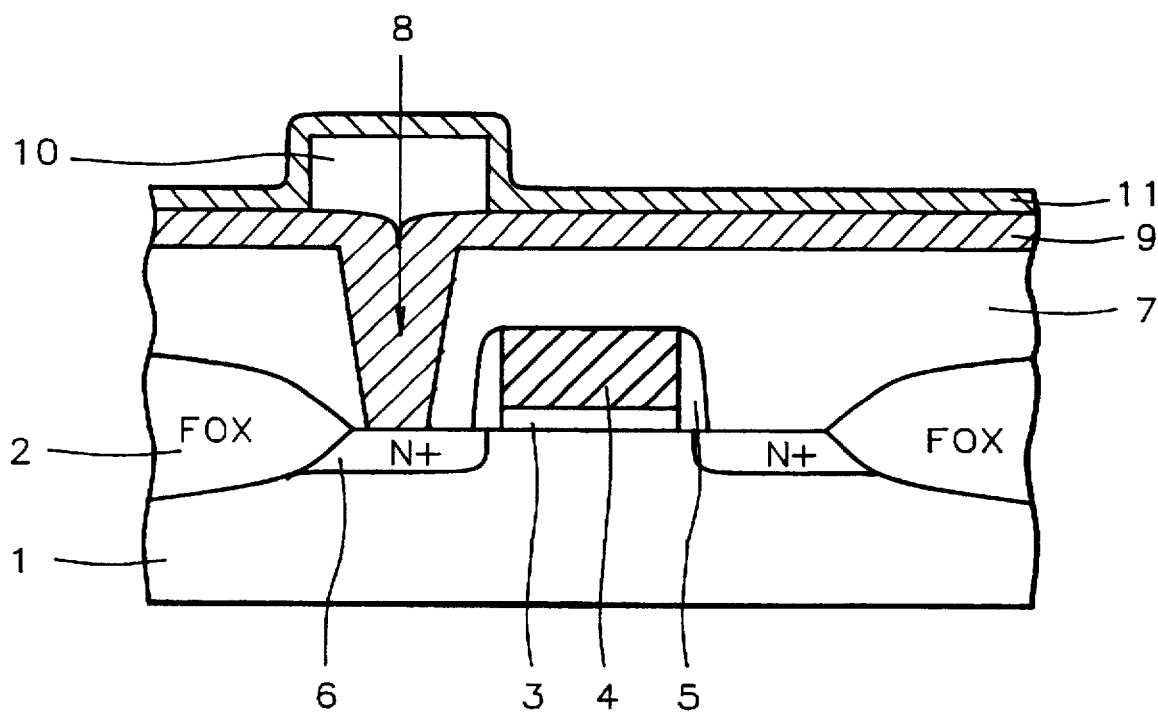
FIG. 2 - Prior Art

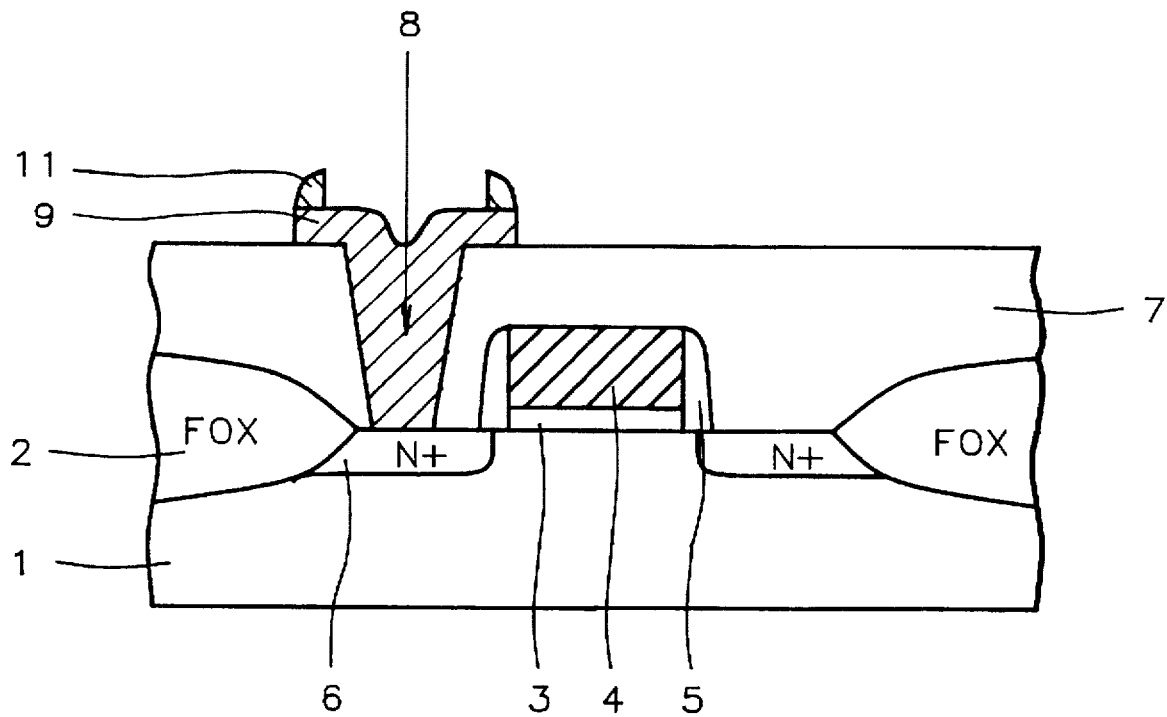
*FIG. 3 — Prior Art*
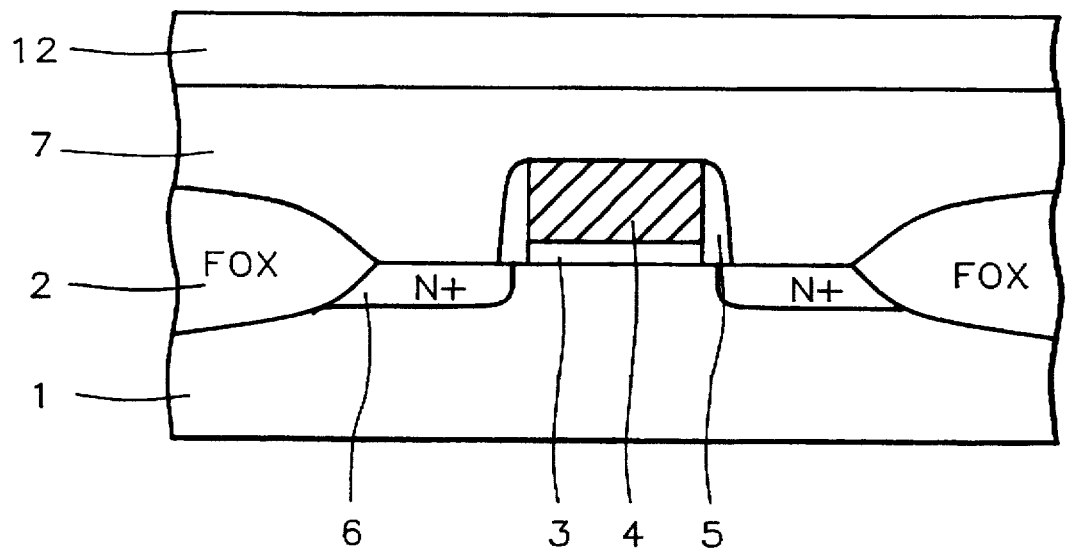
*FIG. 4*

5,789,291

1

DRAM CELL CAPACITOR FABRICATION METHOD

BACKGROUND OF THE INVENTION

1. Field of the Invention

The present invention relates to semiconductor devices, and more particularly to a process for fabricating high density dynamic random access memory, (DRAM), devices.

2. Description of Prior Art

The basic DRAM memory cell is usually composed of a transfer gate transistor and a connected capacitor. Charges are stored in the capacitor section of the DRAM, and are accessed via the transfer gate transistor. A major objective of the semiconductor industry is to continually increase the amount of stored charge in the capacitor, which in turn will result in more optimized device characteristics. One approach used to optimize capacitance is via the use of a stacked capacitor, or stacked storage cell. In this design two conductive layers, such as polycrystalline silicon, are placed over a section of the transfer gate transistor, with a dielectric layer sandwiched between the polycrystalline layers. Cells constructed in this manner are referred to as stacked capacitor cells, (STC).

As DRAM densities increase, resulting in smaller device dimensions, the ability to maintain adequate capacitance using the STC structure becomes difficult. The decreasing size of the transfer gate transistor limits the size of the overlying STC structure, thus limiting capacitance and device signal. The industry has attempted to maintain or increase capacitance, by decreasing the thickness of the dielectric layer of the STC structure. This approach is limited by the yield and reliability risks occurring with the use of very thin insulators. Another approach has been to increase the surface area of the bottom conductive plate, or storage node, without having to increase the size of the underlying transfe gate transistor. This has been accomplished by producing a storage node of polycrystalline silicon, containing a surface of concave and convex protrusions, thus resulting in an increased surface area, without increasing the overall dimension of the DRAM cell. In U.S. Pat. No. 5,290,729, Hayashide, etal, describe a process for producing roughened storage node layers of polysilicon by using a specific set of deposition and annealing conditions. This approach is difficult to control since only a narrow window exists that allows for the growth of this roughened polysilicon layer.

Another approach described by Sim, et al. in U.S. Pat. No. 5,399,518, uses a structural solution to increase storage node area and capacitance. The use of sidewall processes results in a storage node shape resembling a crown, and thus known as the Crown capacitor On Bit line, (COB), structure. This shape, although resulting in greater storage node surface areas than non-COB counterparts, fabricated via the use of more conventional methods, can sometimes present difficulties. For example the polysilicon "fences", created via specific sidewall processes, can break or fall off in specific locations, during subsequent processing, resulting in a decrease in capacitance in three specific regions. This invention will describe an optimized COB structure in which additional increases in storage node area are realized, in comparison to prior art. In addition this invention will show the method used to produce an optimized COB structure, less prone to structural damage, in terms of damaged fences, than counterparts previously disclosed.

SUMMARY OF THE INVENTION

It is an object of this invention to provide a method of fabricating DRAM devices using a stacked capacitor structure.

2

It is another object of this invention to use a capacitor in which the lower electrode is a polysilicon material.

It is yet another object of this invention to create a crowned shaped, polysilicon lower electrode, for purposes of increasing the surface area of the stacked capacitor structure.

It is still yet another object of this invention to create the polysilicon fences or points, of the crown shaped, polysilicon lower electrode, via use of insulator and polysilicon sidewall formation processes.

In accordance with the present invention, a method for fabrication of a DRAM device, using a stacked capacitor structure, in which the bottom electrode of the stacked capacitor structure is comprised of a polysilicon layer exhibiting a crown shape topography, is described. The method consists of initially providing a transfer gate transistor, fabricated using conventional metal oxide semiconductor field effect transistor, (MOSFET), processing. The transfer gate transistor comprises thick field oxide regions on a P type substrate, created for isolation purposes, followed by the growth of a thin thermal oxide gate insulator. A gate electrode, fabricated from doped polysilicon is next formed, followed by the creation of a silicon oxide layer on the sidewall of the polysilicon gate electrode. Source and drain N+ regions are then formed in the P type substrate, between the polysilicon gate electrode and the thick field oxide regions. A first dielectric layer is next deposited and subjected to a planarization procedure using chemical mechanical polishing. A second dielectric layer, different then the first dielectric layer, is then deposited followed by standard photolihographic and reactive ion etching procedures, used to crate a contact hole in the first and second dielectric layers, to an N+ region. A third dielectric layer, similar to the first dielectric layer, is next deposited and subjected to an anisotropic reactive ion etching procedure to create a third dielectric layer on the sidewalls of the first and second dielectric layers in the contact hole. A selective wet etch is next performed to remove the second dielectric layer, leaving a protruding third dielectric sidewall. A polysilicon layer is next deposited on the protruding third dielectric sidewall, as well as on the exposed first dielectric layer, and contacting the N+ region in the exposed contact hole. After doping of the polysilicon, standard photolithographic and reactive ion etching procedures are employed to create the crown shaped, lower electrode, storage node, from the polysilicon layer. Next a thin dielectric composite layer, Oxidized Nitride on silicon Oxide, (ONO), is formed on the patterned polysilicon. Another layer of polysilicon is next deposited, doped, and patterned to create the upper electrode, or cell plate of the stacked capacitor structure. After deposition of an insulator layer, conventional procedures are used to open a contact hole in the insulator to another N+ region. Metallization and patterning are used to create a metal contact to exposed N+ region.

BRIEF DESCRIPTION OF THE DRAWINGS

The object and other advantages of this invention are best described in the preferred embodiment with reference to the attached drawings that include:

FIG. 1, which schematically shows, in cross-sectional representation, the transfer gate transistor section of the DRAM device.

FIGS. 2–3, which schematically show prior art procedures used to obtain improved DRAM capacitance properties.

FIGS. 4–9, which schematiclly, in cross-sectional form, describe the fabrication steps used in this invention, for

DESCRIPTION OF THE PREFERRED EMBODIMENTS

Figure 5:
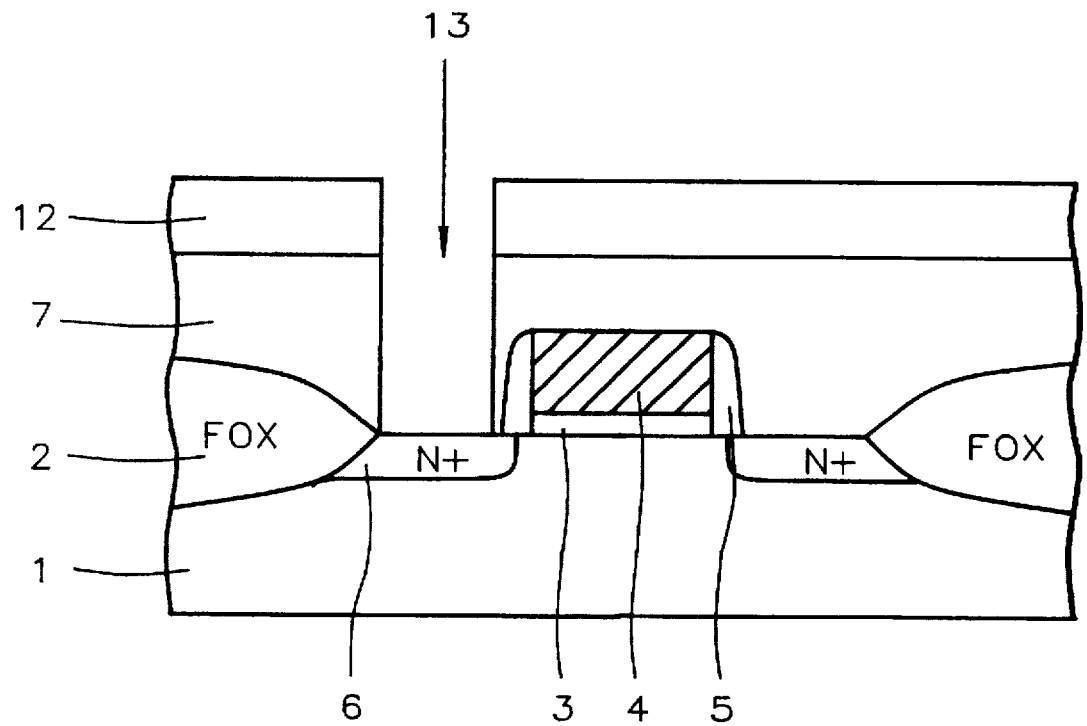

The method of forming DRAM devices, with crown shaped polysilicon storage nodes for improved capacitance characteristics, will now be covered in detail. Conventional DRAM stacked capacitor structures are currently being manufactured in industry, therefore only the specific areas unique to understanding this invention will be described in detail.

FIG. 1 schematically shows a standard transfer gate transistor, used as part of the DRAM cell. Briefly a substrate, 1, composed of P type, single crystalline silicon, with a <100> crystalline orientation, is used. A field oxide region, 2, is formed in the surface of the substrate. This is accomplished by creating an oxidation mask of a thin thermal oxide, followed by a low pressure chemical vapor deposition, (LPCVD), of silicon nitride. After photolithographic and reactive ion etching, (RIE), processing, used to create the desired mask image in the silicon nitride - silicon oxide layers, and removal of the masking photoresist, a field oxide region, 2, is formed via thermal oxidation at a temperature between about 950° to 1050° C., in a steam ambient, to a thickness between about 4000 to 6000 Angstroms. After removal of the silicon nitride, in hot phosphoric acid, and removal of the thin silicon oxide mask in a buffered hydrofluoric acid solution, a thin gate oxide, 3, is grown in a dry oxygen ambient, at a temperature between about 850° to 950° C., to a thickness between about 70 to 300 Angstroms. Next an N type polysilicon layer is deposited using LPCVD procedures. Conventional photolithographic and RIE procedures, using a chlorine chemistry, are used to create the polysilicon gate electrode, 4, shown in FIG. 1. A silicon oxide layer, obtained via the use of either LPCVD or plasma enhanced chemical vapor deposition, (PECVD), is created, followed by an anisotropic RIE procedure, using CHF3, forming the silicon oxide sidewall film, 5. Source and drain regions, 6, are next formed via ion implantaion of arsenic, at an energy between about 50 to 100 Kev., at a dose between about 1E14 to 5E15 atoms/cm2.

FIGS. 2–3, will briefly describe prior art used to create stacked capacitor structures in which the bottom electrode, or storage node, is fabricated in a manner in which the surface area of the bottom electrode is increased via its formed shape. Referring to the transfer gate transistor, shown schematically in FIG. 1, a silicon oxide layer, 7, is deposited using LPCVD or PECVD techniues, and planarized using chemical mechanical polishing procedures, (CMP). A contact hole, 8, to source and drain region 6, is formed in layer, 7, via standard photolithographic and RIE procedures. This is shown in FIG. 2. After photoresist removal and careful wet cleans a polysilicon layer, 9, is deposited using LPCVD procedures, and doped via conventional ion implantation processes. Next another silicon oxide deposition is performed using either LPCVD or PECVD techniques. Again conventional photolithographic and selective RIE procedures are used to create silicon oxide shape, 10. After photoresist removal and careful wet cleans, another layer of polysilicon, 11, is deposited, again using either LPCVD or PEVCD processing, again shown schematically in FIG. 2.

A selective RIE procedure is next employed to create the polysilicon sidewall shape, 11, on oxide shape 10. The polysilicon RIE procedure is extended to also remove the unwanted regions of polysilicon layer, 9. Removal of oxide region 10, in a selective wet etchant, results in the structure schematically illustrated in FIG. 3. It can be seen that the surface area of the storage node, or bottom electrode, has been significantly increased, due to the polysilicon points or fences, 11, created by this sidewall process. The increase in surface area will directly relate to an increase in capacitance and an improved signal for the completed DRAM device. However it should be noted that the removal of oxide shape 10, and subsequent processing, can sometimes result in breakage of the polysilicon fences, 11. It should also be noted that the interface between polysiliocn layer, 9, and polysilicon layer, 11, be free of native. Without a clean interface the increased surface area, achieved via the polysilicon fence process, can not contribute to an increase in capacitance.

A method will now be described in which the vulnerability of the polysilicon fences, needed to increase capacitance of DRAM cells, is significantly reduced. This process will also show how to further increase the surface area of storage nodes, compared to counterparts created using prior art. Referring back to the transfer gate transistor, shown in FIG. 1, a silicon oxide layer, 7, is deposited using either undoped LPCVD or undoped PECVD processing, at a temperature between about 300° to 650° C., to a thickness between about 5000 to 10000 Angstroms. A planarization procedure, using CMP, is employed to obtain the structrue shown in FIG. 4. Next a silicon nitride layer, or a phosphosilicate glass layer, 12, is deposited using either LPCVD or PECVD processing, at a temperature between about 300° to 700° C., to a thickness between about 4000 to 10000 Angstroms. The thickness of the silicon nitride layer is important since the surface area of the subsequent polysilicon fence will be directly related to the silicon nitride thickness. Standard photolithographic and RIE procedures, using CHF3, are employed to open contact hole 13, shown schematically in FIG. 5. Photoresist removal, via oxygen plasma ashing, and careful wet chemical cleans, follow.

Figure 6:
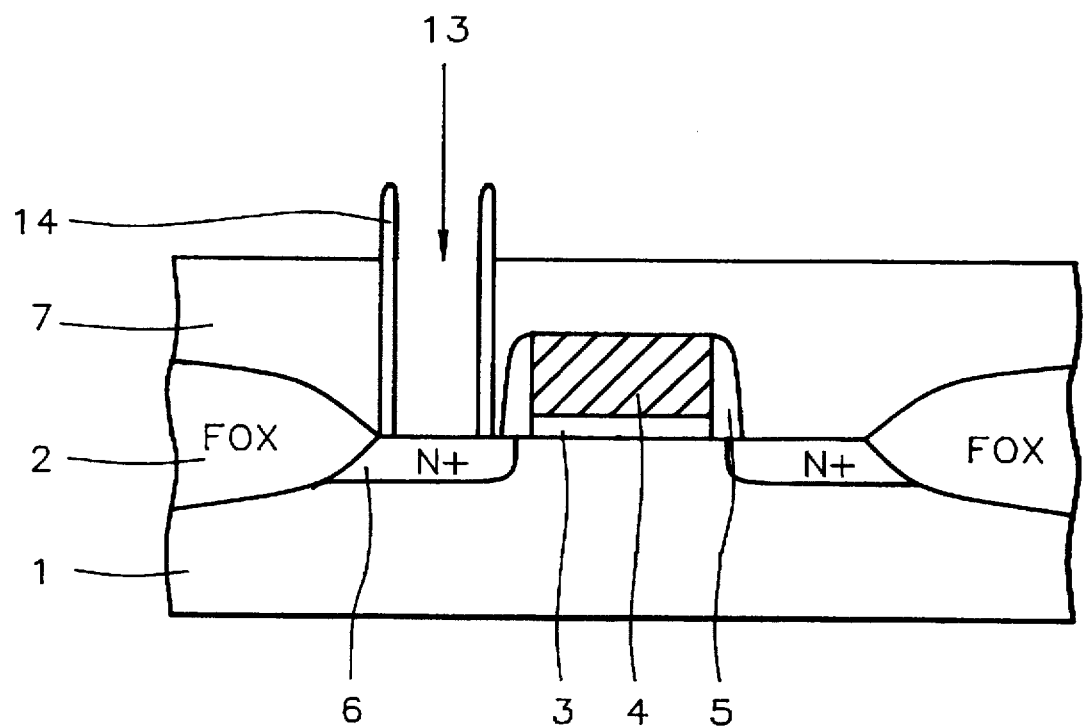

Another layer of undoped silicon oxide is deposited, again using either LPCVD or PECVD processing, at a temperature between about 300° to 650° C., to a thickness between about 500 to 2000 Angstroms. Selective, anisotropic RIE procedures, using CHF3, are used to create silicon oxide spacers, 14, on the sidewalls of contact hole 13. This is shown in FIG. 6. Also shown in FIG. 6 is the removal of silicon nitride, or phosphosilicate glass layer, 12, via selective wet treatments in hot phosphoric acid, or ammonia peroxide, resprctively. It is critical that the removal of silicon nitride be selective, and not attack either sidewall silicon oxide layer, 14, underlying silicon oxide layer, 7, or N+ region, 6. The critical polysilicon layer, 15, to be used as the lower electrode or storage node of the stacked capacitor DRAM structure, is next deposited using LPCVD procedures, at a temperature between about 525° to 575° C., to a thickness between about 500 to 1000 Angstroms.

Figure 7:
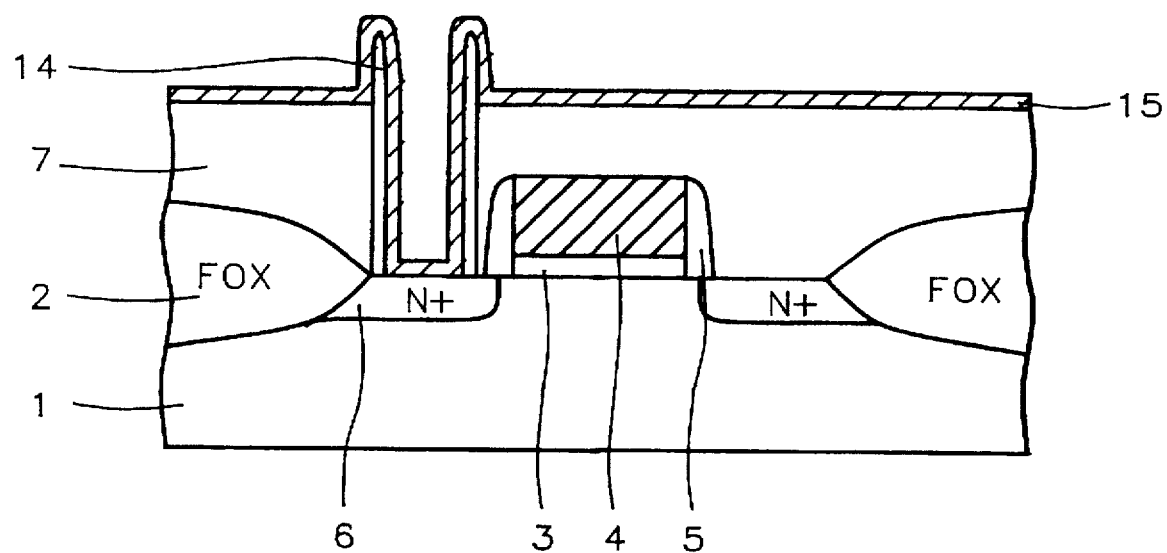
Figure 8:
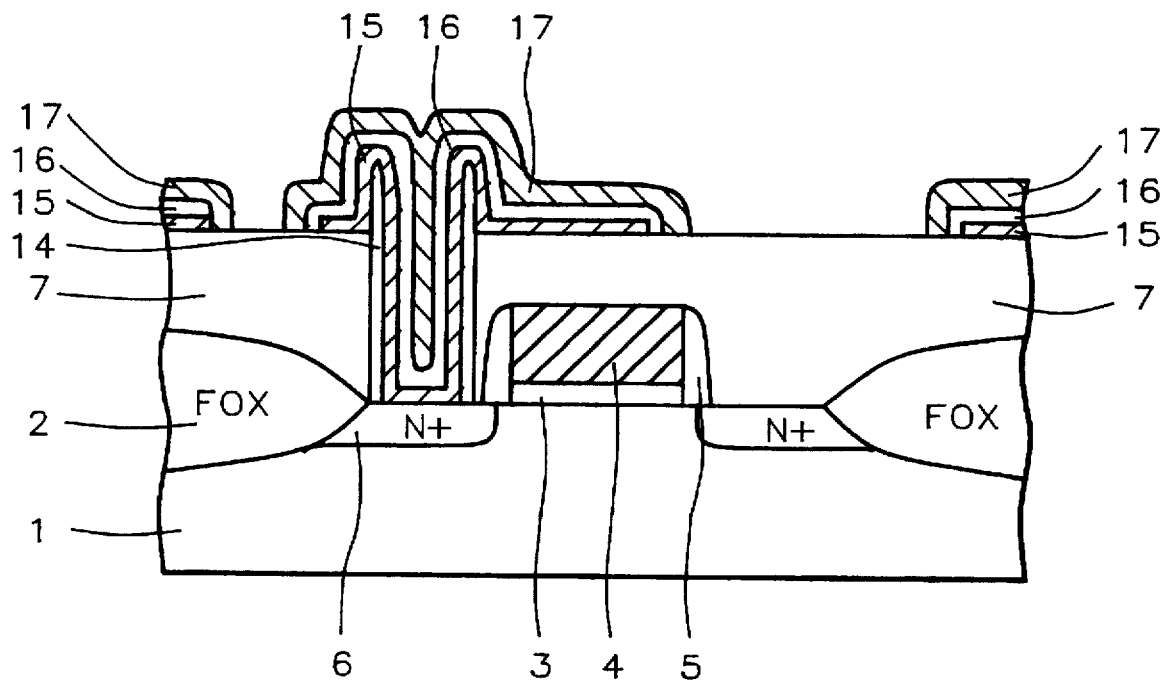

The polysilicon layer, 15, can be deposited via initu doping, using SIH4 and PH3, or deposited intrinsically and then subjected to an ion implantation of phosphorous, at an energy between about 50 to 100 Kev., at a dose between about 1E15 to 1E16 atoms/cm2, followed by an anneal, using either conventional or rapid thermal processing, at a temperature between about 900° to 1000° C. The anneal is critical in distributing the dopant to vertical regions of polysilicon layer 15, which did not receive a significant implant dose due to the 0 to 7 degree ion implantation angle. The in situ doped polysilicon layer 15, is shown schematically in FIG. 7. Conventional photoresist and RIE procedures, using a chlorine chemistry, are then used to separate specific storage node regions, as shown in FIG. 8. It can be seen that the creation of the polysilicon fences, via deposition and sidewall etching, is more robust, and can better withstand subsequent processing procedures, than prior art counterparts, where the polysilicon fences are subjected to more deleterious insulator removal processes. It can also be seen that the surface area of the storage node is not only increased via the creation of polysilicon fences, but the extension of the storage node, to use all available area overlying the transfer gate transistor, offering a significant improvement over prior art counterparts.

After photoresist removal, via oxygen plasma ashing, followed by careful wet cleans a composite dielectric layer, 16, is formed and shown in FIG. 8. The composite dielectric layer, ONO, is created to an equivalent silicon oxide thickness of between about 50 to 150 Angstroms by initially growing a silicon oxide on the exposed polysilicon layer 15, via thermal oxidation at a temperature between about 850° to 950° C., to a thickness between about 40 to 200 Angstroms. Next a thin layer of silicon nitride is deposited using LPCVD techniques, at a temperature between about 650° to 750° C., to a thickness between about 40 to 60 Angstroms. Finally the structure is subjected to an oxygen-steam ambient, at a temperature between about 850° to 950° C., for about 30 min., for purposes of converting the surface of the silicon nitride layer to a silicon oxynitride surface. Another layer of polysilicon is deposited using LPCVD processing, at a temperature between about 525° to 575° C., to a thickness between about 1000 to 2000 Angstroms. Doping of the polysilicon layer is achieved via insitu deposition, or ion implantation of arsenic, at an energy between about 50 to 100 Kev., at a dose between about 1E15 to 5E15 atoms/cm2. Standard photolithographic, and RIE procedures using a chlorine chemistry, are used to create the upper electode, or the cell plate, 17, shown in FIG. 8.

Figure 9:
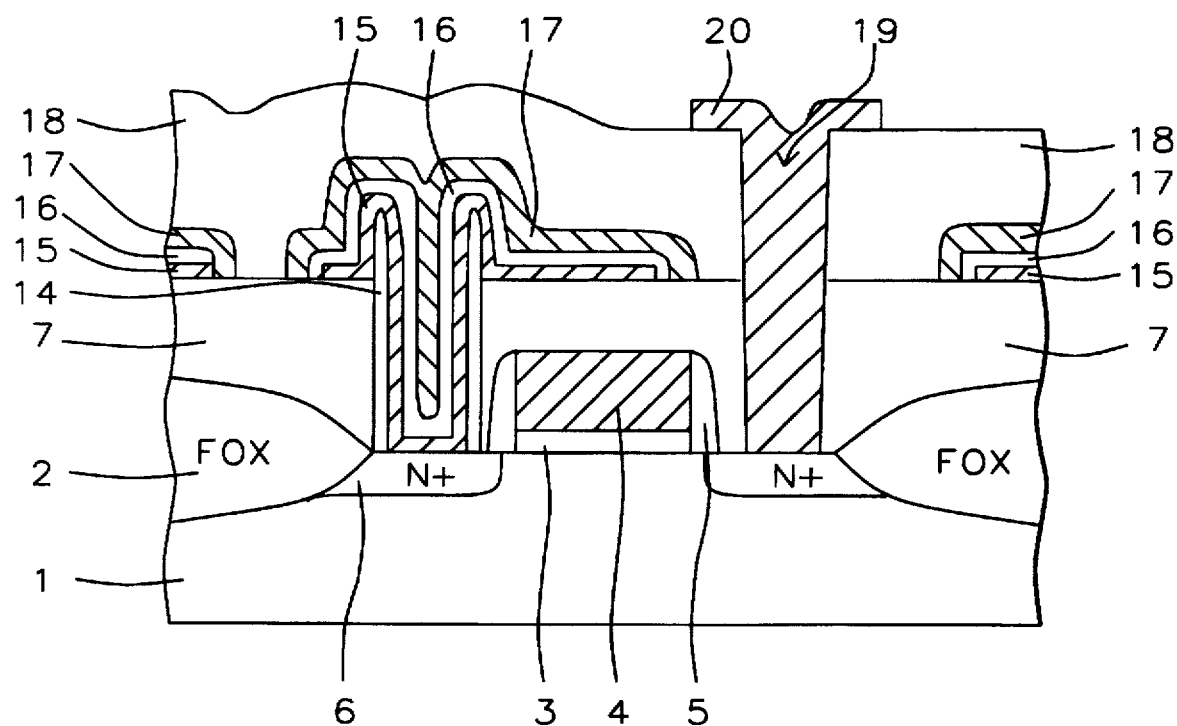

After photoresist removal via oxygen plasma ashing, and careful wet cleans, an insulator layer, silicon oxide, 18, is deposited using either LPCVD or PECVD processing, at a temperature between about 300° to 650° C., to a thickness between about 4000 to 10000 Angstroms. Standard photolithographic procedures, followed by RIE processing, is used to open hole, 19, in silicon oxide layer, 18, to a N+ region, 6. Again oxygen plasma ashing is used to remove photoresist, followed by careful wet cleans, and deposition of either Al—Cu—Si or Ti—TiN—W, to a thickness between about 4000 to 8000 Angstroms. Photoresist and CHBr3 RIE procedures are used to create metal shape 20. Hole 19, as well as metal shape 20, are shown in FIG. 9, after removal of photoresist. Oxygen plasma ashing. Oxygen plasma ashing is used to remove the photoresist.

This process, for DRAM cell capacitor fabrication, although shown with a N channel transfer gate transistor, can also be fabricated with a P channel transfer gate transistor.

While this invention has been particularly shown and described with reference to the preferred embodiments thereof, it will be understood by those skilled in the art that various changes in form and details may be made without departing from the spirit and scope of this invention.

What is claimed is:

1. A method for fabricating stacked capacitor, dynamic random access memory, (DRAM), devices, on a semiconductor substrate, comprising the steps of:

providing a transfer gate transistor on said semiconductor substrate;

depositing a first dielectric layer on said transfer gate transistor;

planarization of said first dielectric layer;

depositing a second dielectric layer on planarized, said first dielectric layer;

opening a first contact hole in said second dielectric layer, and in said first dielectric layer, to a first silicon region on said transfer gate transistor;

depositing a third dielectric layer on surface of said second dielectric layer, on sides of said second dielectric layer and on sides of said first dielectric layer, in said first contact hole, and on said first silicon region on said transfer gate transistor, in said first contact hole;

anisotropic etching of said third dielectric layer to form third dielectric sidewall spacer on sides of said second dielectric layer and on sides of said first dielectric layer, in said first contact hole;

removal of said second dielectric layer, resulting in third dielectric sidewall spacer extensions;

deposition of a first polysilicon layer on all surfaces of said third dielectric sidewall spacer extensions, on said third dielectric sidewall spacer, on said first dielectric layer, and on said first silicon region on said transfer gate transistor, in said first contact hole;

ion implanting a first conductivity imparting dopant into said first polysilicon layer;

annealing to distribute said first conductivity imparting dopant in said first polysilicon layer;

patterning of said first polysilicon layer to form lower electrode structure;

formation of composite dielectric layer on said lower electrode, and on said transfer gate transistor, not covered by said lower electrode structure;

deposition of a second polysilicon layer on said composite dielectric layer;

ion implanting a second conductivity imparting dopant into said second polysilicon layer;

patterning of said second polysilicon layer to form upper electrode structure;

depositing an insulator layer on said upper electrode structure, and on said transfer gate transistor, not covered by said upper electrode structure;

opening a second contact hole in said insulator layer, to a second silicon region in said transfer gate transistor; and forming a metal structure to contact said second silicon region, in said trnasfer gate transistor.

2. The method of claim 1, wherein said transfer gate transistor is an N type field effect transistor, with a gate oxide between about 70 to 300 Angstroms.

3. The method of claim 1, wherein said first dielectric layer is undoped silicon oxide, deposited using either LPCVD or PECVD processing, at a temperature between about 300° to 650° C., to a thickness between about 5000 to 10000 Angstroms.

4. The method of claim 1, wherein said second dielectric layer is silicon nitride, or phosphosilicate glass, deposited using either LPCVD or PECVD processing, at a temperature between about 300° to 700° C., to a thickness between about 4000 to 10000 Angstroms.

5. The method of claim 1, wherein said third dielectric layer is undoped silicon oxide, deposited using either LPCVD or PECVD processing, at a temperature between about 300° to 650° C., to a thickness between about 500 to 2000 Angstroms.

6. The method of claim 1, wherein said third dielectric sidewall spacer is formed via RIE processing using CHF3.

7. The method of claim 1, wherein said second dielectric layer is removed via use of either hot phosphoric acid or ammonia peroxide.

8. The method of claim 1, wherein said first polysilicon layer is deposited using LPCVD processing, at a temperature between about 525° to 575° C., to a thickness between about 500 to 1000 Angstroms.

9. The method of claim 1, wherein said first conductivity imparting dopant is phosphorous, ion implanted at an energy between about 50 to 100 Kev., at a dose between about 1E15 to 1E16 atoms/cm2.

10. The method of claim 1, wherein said first polysilicon layer is annealed at a temperature between about 900° to 1000° C.

11. The method of claim 1, wherein said composite dielectric layer is composed of silicon oxynitride - silicon nitride - silicon oxide, obtained via: oxidation of said first polysilicon layer at a temperature between about 850° to 950° C., to a thickness between about 40 to 200 Angstroms; deposition of a silicon nitride layer, using LPCVD processing, at a temperature between about 650° to 750° C., to a thickness between about 40 to 60 Angstroms; and an oxidation of said silicon nitride layer, at a temperature between about 850° to 950° C., in an oxygen-steam ambient, to form between about 20 to 50 Angstroms of silicon oxynitride.

12. The method of claim 1, wherein said second polysilicon layer is deposited using LPCVD processing, at a temperature between about 525° to 575° C., to a thickness between about 1000 to 2000 Angstroms.

13. The method of claim 1, wherein second conductivity imparting dopant is arsenic, ion implanted at an energy between about 50 to 100 Kev., at a dose between about 1E15 to 5E15 atoms/cm2.

14. A method for fabricating stacked capacitor, dynamic random access memory, (DRAM), devices, on a semiconductor substrate, comprising the steps of:

providing an N channel, transfer gate transistor in said semiconductor substrate;

depositing a first silicon oxide layer on said transfer gate transistor;

planarization of said first silicon oxide layer;

depositing a silicon nitride layer on planarized, said first silicon oxide layer;

opening a first contact hole in said silicon nitride layer, and in said first silicon oxide layer, to a first N type region on said transfer gate transistor;

depositing a second silicon oxide layer on surface of said silicon nitride, on sides of said silicon nitride layer and on sides of said first silicon oxide layer, in said first contact hole, and on said N type region, on said transfer gate transistor, in said first contact hole;

anisotropic etching of said second silicon oxide layer to form silicon oxide sidewall spacer on sides of said silicon nitride layer, and on sides of said first silicon oxide layer, in said first contact hole;

removal of said silicon nitride layer, resulting in said silicon oxide sidewall spacer extensions;

deposition of an insitu doped, first polysilicon layer, on all surfaces of said silicon oxide sidewall spacer extensions, on said silicon oxide sidewall spacer, on said first silicon oxide layer, and on said N type region, on said transfer gate transistor, in said first contact hole;

patterning of said insitu doped, first polysilicon layer, to form storage node structure;

formation of composite dielectric layer on said storage node structure, and on said transfer gate transistor, not covered by said storage node structure;

deposition of a second polysilicon layer on said composite dielectric layer;

ion implanting a first conductivity imparting dopant into said second polysilicon layer;

patterning of said second polysilicon layer to form upper electrode structure;

depositing an insulator layer on said upper electrode structure, and on said transfer gate transistor, not covered by said upper electrode structure;

opening a second contact hole in said insulator layer, to a second N type region on said transfer gate transistor; and forming a metal structure to contact said second N type region, on said transfer gate transistor.

15. The method of claim 14, wherein said transfer gate transistor is an N type field effect transistor, with a gate oxide between about 70 to 300 Angstroms.

16. The method of claim 14 wherein said first silicon oxide layer is undoped, deposited using either LPCVD or PECVD processing, at a temperature between about 300° to 650° C., to a thickness between about 5000 to 10000 Angstroms.

17. The method of claim 14, wherein said silicon nitride, or phosphosilicate glass layer, is deposited using either LPCVD or PECVD processing, at a temperature between about 300° to 700° C., to a thickness between about 4000 to 10000 Angstroms.

18. The method of claim 14, wherein said second silicon oxide layer is undoped, deposited using either LPCVD or PECVD processing, at a temperature between about 300° to 650° C., to a thickness between about 500 to 2000 Angstroms.

19. The method of claim 14, wherein said silicon nitride layer is removed using either hot phosphoric acid, or ammonia peroxide.

20. The method of claim 14, wherein said insitu doped, first polysilicon layer, is deposited at a temperature between about 525° to 575° C., to a thickness between about 500 to 1000 Angstroms, using SiH4 and PH3.

21. The method of claim 14, wherein said composite dielectric layer is composed of silicon oxynitride - silicon nitride - silicon oxide, obtained via oxidation of said insitu doped, first polysilicon layer, at a temperature between about 850° to 950° C., to a thickness between about 40 to 200 Angstroms; deposition of a silicon nitride layer, using LPCVD processing, at a temperature between about 650° to 750° C., to a thickness between about 40 to 60 Angstroms; and an oxidation of said silicon nitride layer, at a temperature between about 850° to 950° C., in an oxygen-steam ambient, to form between about 20 to 50 Angstroms of silicon oxynitride.

22. The method of claim 14, wherein said second polysilicon layer is deposited using LPCVD processing, at a temperature between about 525° to 575° C., to a thickness between about 1000 to 2000 Angstroms.

23. The method of claim 14, wherein said first conductivity imparting dopant is arsenic, ion implanted at an energy between about 50 to 100 Kev., at a dose between about 1E15 to 5E15 atoms/cm2.

* * * * *